United States Patent
Park et al.

(10) Patent No.: US 9,570,684 B2
(45) Date of Patent: Feb. 14, 2017

(54) METHOD OF DOPING 2-DIMENSIONAL SEMICONDUCTOR AND SWITCHING DEVICE

(71) Applicant: Samsung Electronics Co., Ltd., Suwon-Si, Gyeonggi-Do (KR)

(72) Inventors: Jin-hong Park, Suwon-si (KR); Hyung-youl Park, Suwon-si (KR); Jae-woo Shim, Suwon-si (KR); Jae-ho Lee, Seoul (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/340,108

(22) Filed: Jul. 24, 2014

(65) Prior Publication Data
US 2015/0214482 A1   Jul. 30, 2015

(30) Foreign Application Priority Data

Jan. 28, 2014 (KR) .................. 10-2014-0010889

(51) Int. Cl.
*H01L 51/00* (2006.01)
*H01L 21/225* (2006.01)
(Continued)

(52) U.S. Cl.
CPC ........... *H01L 51/002* (2013.01); *H01L 21/225* (2013.01); *H01L 21/2253* (2013.01);
(Continued)

(58) Field of Classification Search
CPC ............. H01L 29/73; H01L 31/035281; H01L 29/778; H01L 31/0324; H01L 29/1033; H01L 29/22; H01L 29/221; H01L 31/109; H01L 31/032; H01L 29/8611; H01L 29/792; H01L 29/78; H01L 29/74; H01L 29/737; H01L 29/66977; H01L 29/24
(Continued)

(56) References Cited

U.S. PATENT DOCUMENTS

| 6,838,720 B2 * | 1/2005 | Krieger | ................. B82Y 10/00 |
| | | | 257/288 |
| 7,182,914 B2 * | 2/2007 | Lai | ......................... B82Y 5/00 |
| | | | 257/27 |

(Continued)

FOREIGN PATENT DOCUMENTS

| KR | 20110006644 A | 1/2011 |
| KR | 2011-0102132 A | 9/2011 |
| KR | 2013-0022854 A | 3/2013 |

OTHER PUBLICATIONS

Baraton, Laurent et al. "Synthesis of few-layered graphene by ion implantation of carbon in nickel thin films." *Nanotechnology*, vol. 22: 2011 (pp. 1-5).

(Continued)

*Primary Examiner* — Michelle Mandala
*Assistant Examiner* — Thai T Vuong
(74) *Attorney, Agent, or Firm* — Harness, Dickey & Pierce, P.L.C.

(57) ABSTRACT

Example embodiments relate to methods of doping a 2-dimensional semiconductor. The method includes forming a semiconductor layer on a substrate, implanting ions into the semiconductor layer, forming a doped layer formed of a 2-dimensional semiconductor layer or an organic semiconductor layer on the semiconductor layer, and doping the doped layer by diffusing the ions of the semiconductor layer into the doped layer through annealing the substrate.

7 Claims, 4 Drawing Sheets

(51) Int. Cl.
  *H01L 21/762* (2006.01)
  *H01L 51/05* (2006.01)
  *H01L 29/16* (2006.01)
  *H01L 29/24* (2006.01)

(52) U.S. Cl.
  CPC .... *H01L 21/76251* (2013.01); *H01L 29/1606* (2013.01); *H01L 29/24* (2013.01); *H01L 51/0558* (2013.01)

(58) Field of Classification Search
  USPC .................................. 438/142; 257/211, 192
  See application file for complete search history.

(56) References Cited

U.S. PATENT DOCUMENTS

| | | | | |
|---|---|---|---|---|
| 8,039,847 | B2* | 10/2011 | Nuzzo | H01L 21/02628 216/2 |
| 2003/0201415 | A1* | 10/2003 | Hoag | C09K 11/06 251/40 |
| 2005/0062082 | A1* | 3/2005 | Bucher | H01L 29/26 257/288 |
| 2006/0011942 | A1* | 1/2006 | Kim | H01L 45/04 257/192 |
| 2006/0166468 | A1* | 7/2006 | Yonehara | C30B 25/02 438/483 |
| 2007/0032089 | A1* | 2/2007 | Nuzzo | H01L 21/02628 438/725 |
| 2009/0014757 | A1* | 1/2009 | Takulapalli | G01N 27/4145 257/253 |
| 2009/0166686 | A1* | 7/2009 | Hunt | B82Y 10/00 257/288 |
| 2010/0044230 | A1* | 2/2010 | Papadimitrakopoulos | B01D 15/08 204/547 |
| 2010/0048005 | A1* | 2/2010 | Seebauer | H01L 21/26513 438/530 |
| 2011/0042649 | A1* | 2/2011 | Duvall | B82Y 10/00 257/27 |
| 2011/0114918 | A1* | 5/2011 | Lin | H01L 29/1606 257/24 |
| 2011/0186818 | A1* | 8/2011 | Bowers | H01L 29/12 257/29 |
| 2011/0309336 | A1* | 12/2011 | Shin | B82Y 10/00 257/29 |
| 2014/0197459 | A1* | 7/2014 | Kis | H01L 29/66742 257/194 |

OTHER PUBLICATIONS

Virendra Singh, Graphene based materials: Past, present and future, Progress in Materials Science, Mar. 2011, 1178-1271 (93 pages), Elsevier Ltd.

* cited by examiner

METHOD OF DOPING 2-DIMENSIONAL SEMICONDUCTOR AND SWITCHING DEVICE

RELATED APPLICATIONS

This application claims priority from Korean Patent Application No. 10-2014-0010889, filed on Jan. 28, 2014, in the Korean Intellectual Property Office, the disclosure of which is incorporated herein in its entirety by reference.

BACKGROUND

1. Field

Example embodiments relate to methods of doping a 2-dimensional semiconductor and an organic semiconductor, and/or flexible switching devices that use the same.

2. Description of the Related Art

Recently, 2-dimensional semiconductors and organic semiconductors that are used in flexible electronic devices have drawn attention. In particular, many studies have been conducted about methods of manufacturing a switching device by using 2-dimensional semiconductors and organic semiconductors. A 2-dimensional semiconductor, such as graphene, may easily have a p-type characteristic by reacting with air. In a semiconductor integrated circuit, not only a p-type semiconductor but also an n-type semiconductor is typically required.

However, it is generally difficult to use an ion injection method to dope a 2-dimensional semiconductor and an organic semiconductor, such as graphene, with an impurity.

There is a need to develop a method of doping a 2-dimensional semiconductor and an organic semiconductor with an impurity.

SUMMARY

Example embodiments relate to methods of doping a 2-dimensional semiconductor by diffusing a dopant through annealing a semiconductor or an insulating layer that includes the dopant.

Additional example embodiments will be set forth in part in the description which follows and, in part, will be apparent from the description, or may be learned by practice of the example embodiments.

According to at least one example embodiments, a method of doping a 2-dimensional semiconductor includes forming a semiconductor layer on a substrate, implanting ions into the semiconductor layer, forming a doped layer formed of a 2-dimensional semiconductor layer or an organic semiconductor layer on the semiconductor layer, and doping the doped layer by diffusing the ions of the semiconductor layer into the doped layer through annealing of the substrate.

The semiconductor layer may be formed of germanium.

The forming of the semiconductor layer may include forming the germanium to a thickness in a range of about 1 µm to about 3 µm.

The 2-dimensional semiconductor may include at least one of $MoS_2$, $WS_2$, $MoSe_2$, and $WSe_2$.

The doped layer may have a thickness in a range from one layer of the 2-dimensional semiconductor to about 30 nm.

The organic semiconductor layer may include at least one of pentacene, anthracene, rubrene, polyacetylene, poly(2-hexylthiophene), and poly(p-phenylene vinylene).

The doped layer may be an organic semiconductor having a thickness in a range of about 5 nm to about 30 nm.

Annealing the substrate may be performed in a furnace at a temperature in a range from about 300° C. to about 600° C. under a nitrogen atmosphere.

According to at least one example embodiment, a method of doping a 2-dimensional semiconductor includes forming an insulating layer on a substrate, moving an impurity of the insulating layer to a surface of the insulating layer by primarily annealing the substrate, forming a doped layer formed of a 2-dimensional semiconductor or an organic semiconductor on the insulating layer, and doping the doped layer by diffusing the impurity into the doped layer through secondarily annealing the substrate.

The insulating layer may include phosphorus silica glass (PSG), boron silica glass (BSG), boron phosphorus silica glass (BPSG), or arsenic silica glass (ASG).

The insulating layer may have a thickness in a range of about 30 nm to about 300 nm.

The primarily annealing may include annealing the substrate in a furnace that is maintained at a temperature in a range of about 700° C. to about 900° C. under a nitrogen atmosphere.

The secondarily annealing may include annealing the substrate in a furnace that is maintained at a temperature in a range of about 300° C. to about 600° C. under a nitrogen atmosphere.

According to at least one example embodiment, a switching device includes a doped layer on a substrate, the doped layer doped with an impurity, a source electrode and a drain electrode that are electrically connected to both edges of the substrate on the substrate, respectively, a gate insulating layer on the doped layer between the source electrode and the drain electrode on the doped layer, and a gate electrode on the gate insulating layer, wherein the doped layer is formed of a 2-dimensional semiconductor or an organic semiconductor.

The gate insulating layer may be formed of a polymer.

The switching device may be a transistor having the same polarity as the polarity of the doped layer.

The substrate may be formed of a polymer.

The switching device may be flexible.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Hereinafter, example embodiments will be described more fully with reference to the accompanying drawings, in which the example embodiments are shown. The embodiments described below are only examples, and thus, various modifications may be made from the embodiments.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIGS. 1A through 1F are cross-sectional views for sequentially explaining a method of doping a 2-dimensional semiconductor with an impurity, according to example embodiments.

Referring to FIG. 1, a substrate 110 is prepared. The substrate 110 may be a silicon substrate that is widely used in semiconductor processes. However, the substrate 110 according to example embodiments is not limited thereto, and the substrate 110 may be formed of, for example, glass or metal or other material.

Figure 1A:
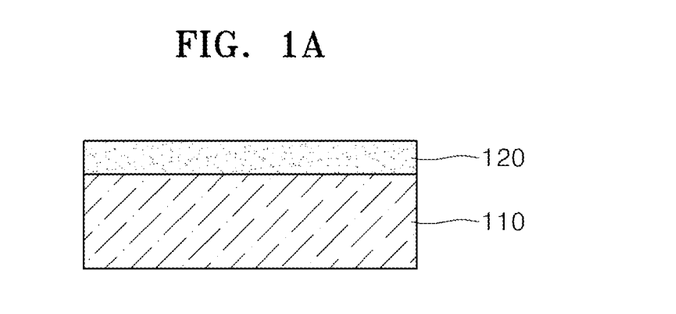
FIGS. 1A through 1F are cross-sectional views for sequentially explaining a method of doping an impurity in a 2-dimensional semiconductor according to example embodiments.

A material layer that easily diffuses impurities is formed on the substrate 110. For example, a semiconductor layer 120 is formed on the substrate 110. The semiconductor layer

120 may be epitaxially grown or may be formed by using a thermal evaporation method or an e-beam evaporation method on the substrate 110.

According to at least one example embodiment, the semiconductor layer 120 may be formed of, or include, Germanium. Germanium may easily diffuse an impurity included therein at relatively low temperature. When Germanium is epitaxially grown on the substrate 110, the substrate 110 may be formed of Silicon. The semiconductor layer 120 may be deposited to a thickness in a range from about 1 µm to about 3 µm to facilitate an ion implantation into the semiconductor layer 120. When the semiconductor layer 120 has a thickness smaller than 1 µm, the ion implantation into the semiconductor layer 120 may be difficult. When the semiconductor layer 120 has a thickness greater than 3 µm, a material cost and a removal cost of the semiconductor layer 120 may be increased, as described below.

Figure 1B:
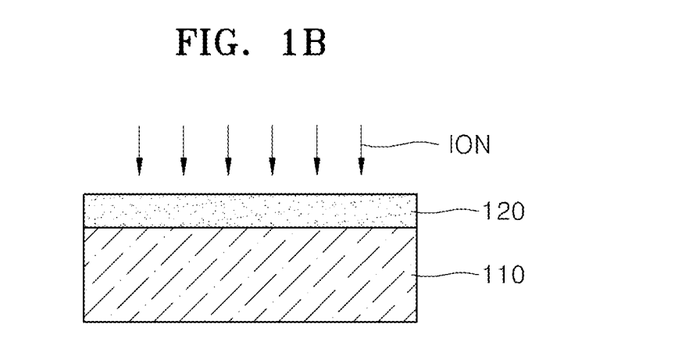

Referring to FIG. 1B, an impurity is ion-implanted from an upper surface of the semiconductor layer 120. The impurity to be ion implanted may vary according to a material formed on the semiconductor layer 120.

Figure 1C:
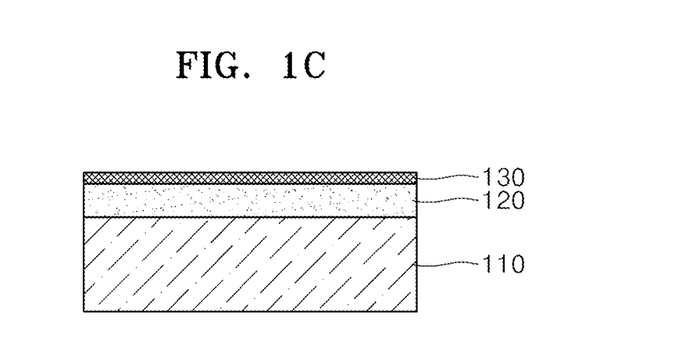

Referring to FIG. 1C, a doped layer 130 is formed on the semiconductor layer 120. The doped layer 130 may be a 2-dimensional semiconductor layer or an organic semiconductor layer. The 2-dimensional semiconductor layer may include at least one of graphene, $MoS_2$, $WS_2$, $MoSe_2$, and $WSe_2$. The doped layer 130 formed of a 2-dimensional semiconductor layer may be formed by using a transferring method.

According to at least one example embodiment, when the doped layer 130 is or includes a 2-dimensional semiconductor, the doped layer 130 may have a thickness in a range from about one layer of the 2-dimensional semiconductor to about 30 nm. The thickness of one layer of the 2-dimensional semiconductor may be in a range from about 0.6 nm to about 0.8 nm.

The organic semiconductor layer may be formed of an organic polymer semiconductor including one of polycyclic aromatic hydrocarbon polyacetylene, poly(2-hexylthiophene), and poly(p-phenylene vinylene). The polycyclic aromatic hydrocarbon includes pentacene, anthracene, or rubrene. The doped layer 130 formed of an organic semiconductor layer may be formed by using a chemical vapor deposition (CVD) method, a thermal evaporation method, or a sputtering method.

When the doped layer 130 is formed of an organic semiconductor, the doped layer 130 may have a thickness in a range of about 5 nm to about 30 nm.

Next, the impurity implanted into the semiconductor layer 120 is diffused outwards by annealing. For annealing the semiconductor layer 120, after disposing the substrate 110 in a furnace, the semiconductor layer 120 is heated to a temperature in a range from about 300° C. to about 600° C. for substantially one hour. While the semiconductor layer 120 is annealed, the impurity that is implanted into the semiconductor layer 120 diffuses into the doped layer 130. Accordingly, the doped layer 130 may be a p-type layer or an n-type doped layer according to the type of implanted impurity. The impurity diffused into the doped layer 130 may be mostly absorbed on a lower side of the doped layer 130.

Figure 1D:
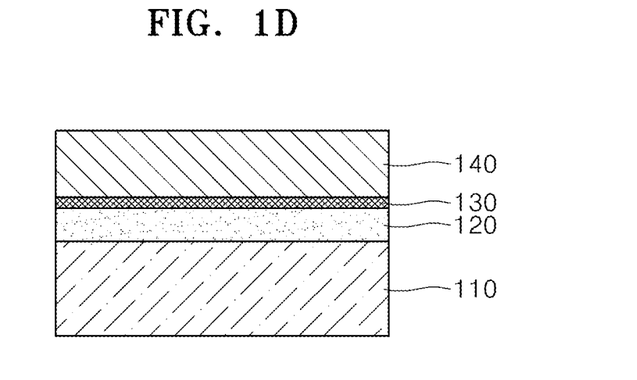

Referring to FIG. 1D, a supporting member 140 is formed on the doped layer 130. As the supporting member 140, e.g., poly methyl methacrylate (PDMA) is attached on the doped layer 130, or a coating layer may be formed on the doped layer 130 by coating Poly Methyl MethAcrylate (PMMA).

Figure 1E:
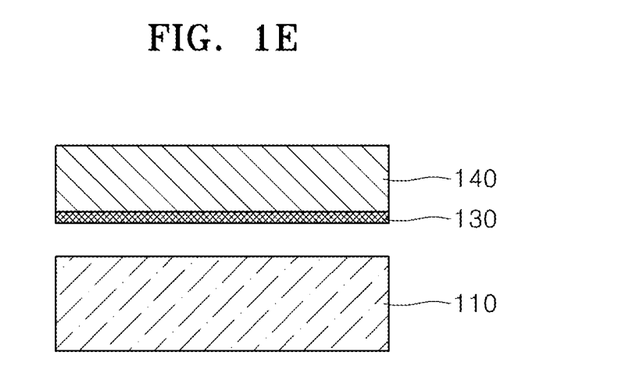

Referring to FIG. 1E, the doped layer 130 may be obtained by removing the semiconductor layer 120. The semiconductor layer 120 may be removed by performing, for example, a wet etching method with an etchant, such as KOH or $H_2O_2$.

Figure 1F:
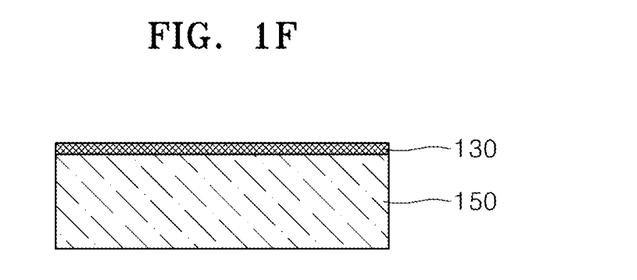

Referring to FIG. 1F, after disposing the doped layer 130 on a target substrate 150, the supporting member 140 is removed.

As a result of the example method described above, ions may be indirectly and stably doped on a 2-dimensional semiconductor layer or an organic semiconductor layer into which ions may not be typically easily implanted. The doped 2-dimensional semiconductor layer or the organic semiconductor layer may be used in flexible switching devices.

Figure 2A:
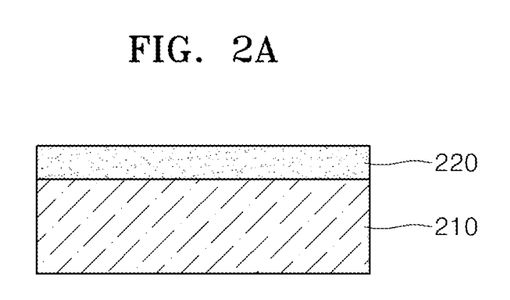
FIGS. 2A through 2C are cross-sectional views for sequentially explaining a method of doping an impurity in a 2-dimensional semiconductor according to example embodiments.
Figure 2B:
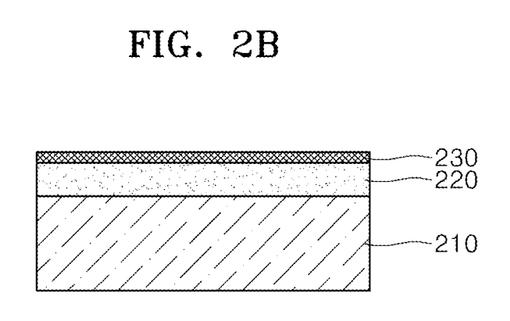
Figure 2C:
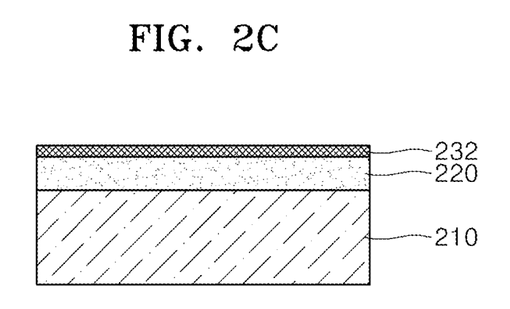

FIGS. 2A through 2C are cross-sectional views for sequentially explaining a method of doping an impurity in a 2-dimensional semiconductor, according to example embodiments.

Referring to FIG. 2A, a substrate 210 is prepared. The substrate 210 may be, e.g., a silicon substrate that is widely used in semiconductor processes. However, the substrate 210 according to example embodiments is not limited thereto, and the substrate 210 may be formed of, for example, glass or metal.

A material layer that easily diffuses impurities is formed on the substrate 210. For example, an insulating layer 220 is formed on the substrate 210. The insulating layer 220 may be formed of phosphorus silica glass (PSG), boron silica glass (BSG), boron phosphorus silica glass (BPSG), or arsenic silica glass (ASG). The insulating layer 220 may have a thickness in a range from about 30 nm to about 300 nm.

Next, an impurity is moved to a surface of the insulating layer 220 by annealing the insulating layer 220. The impurity that is included in the insulating layer 220 may be phosphorus, boron, or arsenide.

For annealing the insulating layer 220, after disposing the substrate 210 in a furnace that is in a nitrogen atmosphere, the insulating layer 220 is heated at a temperature in a range of about 700° C. to about 900° C. for substantially one hour. During the annealing process, the impurity diffuses to a surface of the insulating layer 220.

Referring to FIG. 2B, a doped layer 230 is formed on the insulating layer 220. The doped layer 230 may be a 2-dimensional semiconductor layer or an organic semiconductor layer. The 2-dimensional semiconductor layer may be formed of, or include, at least one of graphene, $MoS_2$, $WS_2$, $MoSe_2$, and $WSe_2$. The doped layer 230 may be formed by using a transferring method.

When the doped layer 230 is formed of, or includes, a 2-dimensional semiconductor, the doped layer 230 may have a thickness in a range of about one layer of the 2-dimensional semiconductor to about 30 nm. The thickness of one layer of the 2-dimensional semiconductor may be in a range from about 0.6 nm to about 0.8 nm.

The organic semiconductor layer may be formed of an organic polymer semiconductor that includes polycyclic aromatic hydrocarbon polyacetylene, poly(2-hexylthiophene), or poly(p-phenylene vinylene). The polycyclic aromatic hydrocarbon includes pentacene, anthracene, or rubrene. The doped layer 230 formed of an organic semiconductor layer may be formed by using, e.g., a CVD method, a thermal evaporation method, or a sputtering method.

When the doped layer 230 is formed of an organic semiconductor, the doped layer 230 may have a thickness in a range of about 5 nm to about 30 nm.

Referring to FIG. 2C, the impurity implanted into the insulating layer 220 is diffused outwards to the doped layer 230 by annealing the insulating layer 220.

For annealing the insulating layer 220, after disposing the substrate 210 in a furnace that is kept under a nitrogen atmosphere, the insulating layer 220 is heated to a temperature in a range of about 300° C. to about 600° C. for substantially one hour. While annealing, the impurity implanted into the insulating layer 220 diffuses into the doped layer 230. Accordingly, the resulting doped layer 232 doped with an impurity may be a p-type layer or an n-type layer, according to the implanted impurity. The impurity diffused into the doped layer 232 may be mostly absorbed between the doped layer 232 and the insulating layer 220.

The resultant product of FIG. 2C may be used to manufacture a flexible switching device, such as a flexible transistor.

As a result of the example method described above, ions may be indirectly and stably doped into a 2-dimensional semiconductor or an organic semiconductor into which direct implantation may be difficult. The doped 2-dimensional semiconductor or the organic semiconductor may be used in flexible electronic devices. In particular, since an insulating layer and a doped semiconductor layer are stacked on a substrate, a device can be directly formed on the doped layer.

Figure 3:
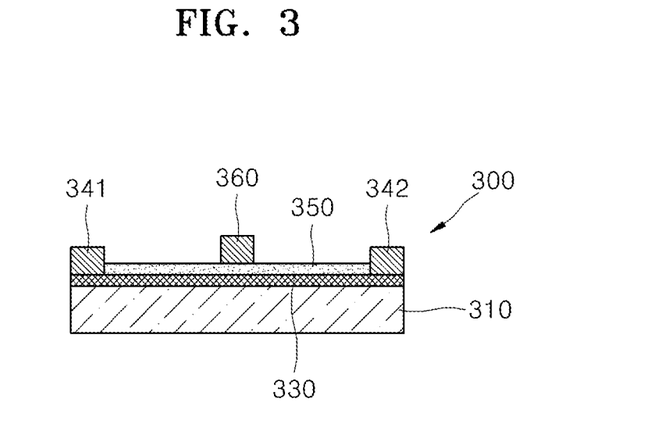
FIG. 3 is a schematic cross-sectional view of a structure of a switching device according to example embodiments.

FIG. 3 is a schematic cross-sectional view of a structure of a switching device 300 that uses a doped layer that is manufactured by using the example method described above.

Referring to FIG. 3, a doped layer 330 is disposed on a substrate 310. A source electrode 341 and a drain electrode 342 are respectively electrically connected to both edges of the doped layer 330. A gate insulating layer 350 is formed between the source and drain electrodes 341 and 342 on the doped layer 330, and a gate electrode 360 is formed on the gate insulating layer 350.

According to at least one example embodiment, the substrate 310 may be a flexible substrate. The substrate 310 may be formed of, or include, a flexible material, for example, polyethylenenaphthalate (PEN), polyethyleneterephthalate (PET), polycarbonate, polyvinylalcohol, polyacrylate, polyimide, polynorbornene, or polyethersulfone (PES).

The doped layer 330 may be a 2-dimensional semiconductor layer or an organic semiconductor layer. The 2-dimensional semiconductor layer may be formed of at least one of graphene, $MoS_2$, $WS_2$, $MoSe_2$, and $WSe_2$. The doped layer 330 formed of a 2-dimensional semiconductor layer may be formed by using a transferring method.

The doped layer 330 may be a p-type doped layer or an n-type doped layer according to the type of impurity. The doped layer 330 may be a pathway of carriers, and thus, may be performed as a channel. When the doped layer 330 is doped with a p-type impurity, the switching device 300 is a p-type transistor. When the doped layer 330 is doped with an n-type impurity, the switching device 300 is an n-type transistor. The doped layer 330 may be well understood from the doped layer 130 or 230, and thus, the detailed description thereof will be omitted.

When the doped layer 330 is formed of a 2-dimensional semiconductor, the doped layer 330 may have a thickness in a range from about one layer of the 2-dimensional semiconductor to about 30 nm. The thickness of one layer of the 2-dimensional semiconductor may be in a range of about 0.6 nm to about 0.8 nm.

The organic semiconductor layer may be formed of an organic polymer semiconductor that includes polycyclic aromatic hydrocarbon, polyacetylene, poly(2-hexylthiophene), or poly(p-phenylene vinylene). The polycyclic aromatic hydrocarbon includes pentacene, anthracene, or rubrene. The doped layer 330 formed of an organic semiconductor layer may be formed by using a CVD method, a thermal evaporation method, or a sputtering method.

When the doped layer 330 is formed of an organic semiconductor, the doped layer 330 may have a thickness in a range of about 5 nm to about 30 nm.

The source electrode 341, the drain electrode 342, and the gate electrode 360 may be formed of metal or silicon.

The gate insulating layer 350 may be formed of silicon oxide, silicon nitride, or a polymer, such as poly(methyl methacrylate (PMMA), or poly(2-hydroxyethyl methacrylate (PHEMA).

A switching device according to example embodiments may be readily used to realize a flexible switching device since the substrate is flexible and a doped layer doped with an impurity is used as a channel.

As described above, according to example embodiments, the doping method may indirectly and stably dope ions into 2-dimensional semiconductor or an organic semiconductor, which may be difficult to be directly doped. The doped 2-dimensional semiconductor or the organic semiconductor may be used in flexible electronic devices.

In particular, when a semiconductor layer on an insulating layer is doped with an impurity included in the insulating layer on a substrate, since the insulating layer and the doped semiconductor layer are stacked on the substrate, a direct manufacture of a device on the doped semiconductor layer may be possible.

While one or more example embodiments have been described with reference to the figures, it will be understood by those of ordinary skill in the art that various changes in form and details may be made therein without departing from the spirit and scope defined by the following claims.

What is claimed is:

1. A method of doping a 2-dimensional semiconductor, the method consisting of, in sequence:
    forming a semiconductor layer on a substrate;
    implanting ions into the semiconductor layer;
    forming a doped layer including a 2-dimensional semiconductor layer or an organic semiconductor layer on the semiconductor layer after the implanting of ions into the semiconductor layer; and
    doping the doped layer by diffusing the implanted ions of the semiconductor layer into the doped layer through annealing of the semiconductor layer;
    wherein the 2-dimensional semiconductor includes at least one of graphene, $WS_2$, $MoSe_2$, and $WSe_2$.

2. The method of claim 1, wherein the semiconductor layer comprises germanium.

3. The method of claim 2, wherein the forming of the semiconductor layer comprises forming the germanium to a thickness in a range of about 1 μm to about 3 μm.

4. The method of claim 1, wherein the doped layer is formed to a thickness in a range of one layer of the 2-dimensional semiconductor to about 30 nm.

5. The method of claim 1, wherein the organic semiconductor layer comprises at least one of pentacene, anthracene, rubrene, polyacetylene, poly(2-hexylthiophene), and poly(p-phenylene vinylene).

6. The method of claim 5, wherein the organic semiconductor layer has a thickness in a range of about 5 nm to about 30 nm.

7. The method of claim 1, wherein the annealing of the substrate is performed at a temperature in a range of about 300° C. to about 600° C. under a nitrogen atmosphere.

* * * * *